United States Patent [19]

Fukumoto

[11] Patent Number: 4,638,466

[45] Date of Patent: Jan. 20, 1987

[54] PROGRAMMABLE SEMICONDUCTOR MEMORY DEVICE HAVING SEPARATE READ WORD LINE DRIVERS AND WRITE-ONLY WORD LINE DRIVERS

[75] Inventor: Toshio Fukumoto, Yokohama, Japan

[73] Assignee: Fujitsu Limited, Kawasaki, Japan

[21] Appl. No.: 687,353

[22] Filed: Dec. 31, 1984

[30] Foreign Application Priority Data

Dec. 29, 1983 [JP] Japan ................. 58-247702

[51] Int. Cl.$^4$ ............................................. G11C 8/00
[52] U.S. Cl. ................................... 365/230; 365/104; 365/96
[58] Field of Search ................. 365/96, 104, 103, 105, 365/94, 189, 230, 175, 200; 307/449, 463

[56] References Cited

U.S. PATENT DOCUMENTS

| | | | |
|---|---|---|---|
| 4,125,880 | 11/1978 | Taylor | 365/242 |
| 4,287,569 | 9/1981 | Fukushima | 365/96 |
| 4,432,070 | 2/1984 | Moss | 365/96 |
| 4,577,294 | 3/1986 | Brown et al. | 365/200 |

*Primary Examiner*—Stuart N. Hecker
*Assistant Examiner*—Glenn A. Gossage
*Attorney, Agent, or Firm*—Armstrong, Nikaido, Marmelstein & Kubovcik

[57] ABSTRACT

A programmable semiconductor memory device provided with a read word line driver and a write-only word line driver. The write-only word line driver is disconnected from the lines after a write operation. The read word line driver has read-driving output transistors, the emitter areas of which are smaller than the emitter areas of the write driving output transistor. Thus, the accessing speed for a read operation is improved.

6 Claims, 4 Drawing Figures

PROGRAMMABLE SEMICONDUCTOR MEMORY DEVICE HAVING SEPARATE READ WORD LINE DRIVERS AND WRITE-ONLY WORD LINE DRIVERS

BACKGROUND OF THE INVENTION (1) Field of the Invention

The present invention relates to a programmable semiconductor memory device, and more particularly, to a programmable semiconductor memory device such as a programmable read memory (PROM), a field programmable logic array, (FPLA), and the like, in which a write-only word line driver and a read word line driver are provided separately to improve the accessing speed to a word line during a read operation.

(2) Description of the Related Art

In general, a programmable semiconductor memory device comprises programmable memory cells arranged on respective intersecting portions between a plurality of word lines and a plurality of bit lines. Writing data into or reading data from a selected memory cell is carried out by driving a selected bit line and a selected word line. The selection of the word line is effected by a word line address decoder. The driving of the word line is effected by a word line driver. That is, writing data into or reading data from the selected programmable memory cell is carried out by absorbing a current from the selected bit line, through the selected memory cell and through the selected word line, into the word line driver.

Because the accessing speed for the selection and driving of a word line is increased with the decrease of the emitter area of each output transistor in the word line driver, the emitter area of the output transistor should be large enough to enable it to withstand the electric current absorbed by the word line driver.

Conventionally, a single word line driver is commonly used both for writing and for reading. The current absorbed during writing, however, is much larger than the current absorbed during reading, as later described in more detail with reference to the drawings. Therefore, the emitter areas of the output transistors in the word line driver are designed to be able to withstand the write-in currents. However, because of the resulting large emitter area, the output transistor has a large parasitic capacitance, which raises a problem of an undesirable reduction of the accessing speed to a word line during a usual read operation.

SUMMARY OF THE INVENTION

In view of the above mentioned problem in the conventional technique, an object of the present invention is, in a programmable semiconductor memory device, to improve the word line accessing speed during a read operation based on the idea of separately providing a write-only word line driver and a read word line driver and by decreasing the emitter area in each output transistor in the read word line driver.

To attain the above object, there is provided, according to the present invention, a programmable semiconductor memory device comprising: a plurality of word lines; a plurality of bit lines intersecting the word lines; programmable memory cells arranged on respective intersecting portions between the word lines and the bit lines; a word line address decoder for selecting one of the word lines in response to an input address signal; a read word line driver for absorbing a current from the selected word line during a read operation of the programmable memory cells, based on the output signal from the word line address decoder; a write-only word line driver for absorbing a current from the selected word line during a write operation of the programmable memory cell, based on the output signal from the word line address decoder; and a cutting means for cutting the connection between the write-only word line driver and the word lines.

The read word line driver comprises a current-absorption-inhibiting means for inhibiting the absorption of current from the word lines during a write operation of the programmable memory cells.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Before describing the embodiments of the present invention, a conventional programmable semiconductor memory device will be first described with reference to FIG. 1.

Figure 1:
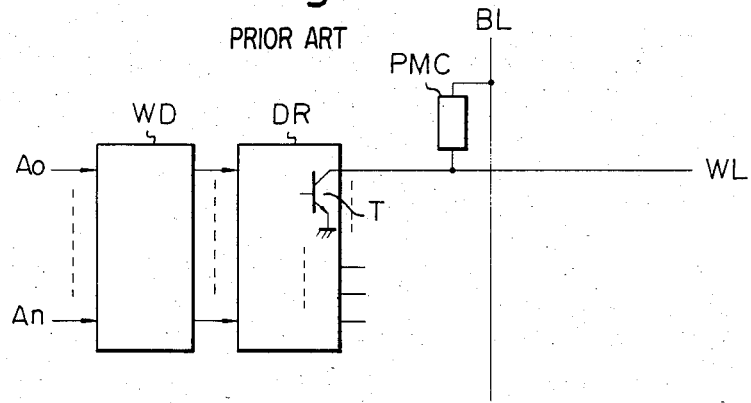
FIG. 1 is a block circuit diagram showing a conventional programmable semiconductor memory device.

As shown in FIG. 1, conventionally a single word line driver is commonly used both during writing and reading. That is, writing data into a programmable memory cell PMC arranged on an intersecting portion between a selected bit line BL and a selected word line WL is carried out in such a manner that a transistor T in a word line driver DR absorbs a write-in current from the bit line BL through the programmable memory cell PMC and through the word line WL. When the write-in current is larger than a predetermined value, the programmable memory cell PMC is destroyed by the write-in current, and thus a data, for example, "0", is written-in to the memory cell PMC. Conversely, when the write-in current is smaller than the above-mentioned predetermined value, the programmable memory cell PMC is not destroyed, and thus a data, for example, "1", is written-in. Therefore, the output transistor T in the word line driver DR should be able to absorb a large current of, for example, 125 mA through 200 mA, which is sufficient to destroy the programmable memory cell PMC.

On the other hand, reading data written in the programmable memory cell PMC is carried out by trying to absorb a read-out current from the bit line BL through the programmable memory cell PMC and through the word line WL to the same output transistor T in the word line driver DR. When the programmable memory cell PMC is conductive for the current, the data "1" is read out. When it is not conductive, the data "0" is read out. It should be noted, however, that the read-out current need not be as large as the write-in current.

Since the conventional word line driver DR is commonly used both for a read operation and for a write operation, the emitter area of the output transistor T in the word line driver DR is designed to be large enough to be able to withstand the write-in current. However, because of this large emitter area, the output transistor has a large parasitic capacitance which raises the problem of an undesirable reduction in the accessing speed to the word line during a read operation, as mentioned previously.

Figure 2:
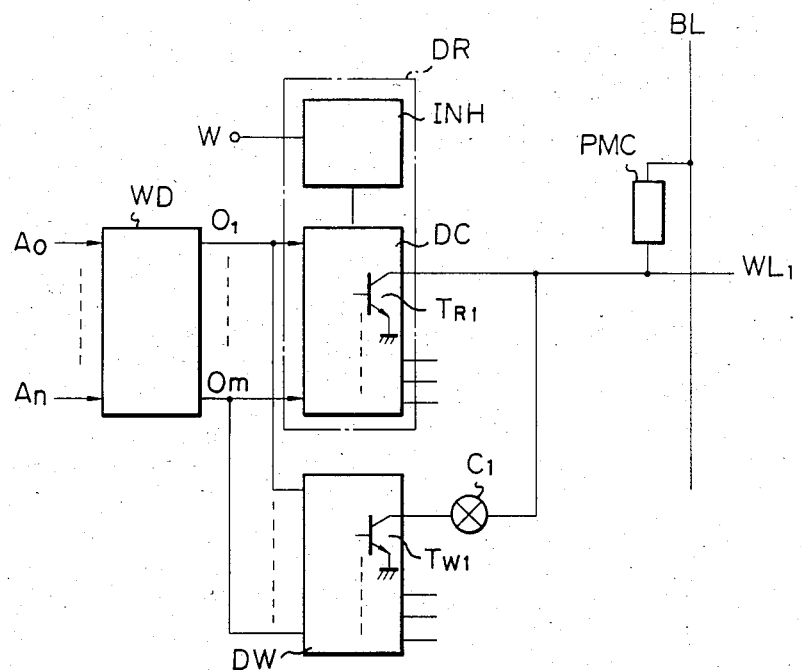
FIG. 2 is a block circuit diagram showing a programmable semiconductor memory device according to an embodiment of the present invention.

FIG. 2 shows a general constitution of a programmable semiconductor memory device according to an embodiment of the present invention. In FIG. 2, a word line decoder WD has a plurality of inputs for receiving input address signals $A_0, \ldots,$ and $A_n$, and a plurality of outputs $O_1, \ldots,$ and $O_m$. The word line decoder WD decodes the input signals $A_0, \ldots,$ and $A_n$, and then, in accordance with the result of the decoding, selects one of the outputs $O_1$ through $O_m$ to be turned from a low logic level (L level) to a high logic level (H level). The outputs $O_1$ through $O_m$ of the word line decoder WD are connected to inputs of a driving circuit included in a read word line driver DR and to inputs of a write-only word line driver DW. The read word line driver DR and the write-only word line driver DW are provided separately according to the present invention. The driver circuit DC in the read word line driver DR has readdriving output transistors $T_{R1}$ through $T_{Rm}$ corresponding, respectively, to the outputs $O_1$ through $O_m$ of the word line decoder WD, and the write-only word line driver DW has write-driving output transistors $T_{W1}$ through $T_{Wm}$ corresponding, respectively, to the outputs $O_1$ through $O_m$. In the figure, for the sake of simplicity, only the transistors $T_{R1}$ and $T_{W1}$ are illustrated. The bases of the output transistors $T_{R1}$ through $T_{Rm}$, and the output transistors $T_{W1}$ through $T_{Wm}$, are adapted to receive, respectively, word line selecting signals from the outputs $O_1$ through $O_m$ of the word line decoder WD. The collectors of the output transistors $T_{R1}$ through $T_{Rm}$ in the read word line driver DR are connected, respectively, to word lines $WL_1$ through $WL_m$. In the figure, for the sake of simplicity, only the word line $WL_1$ is illustrated. The collectors of the output transistors $T_{W1}$ through $T_{Wm}$ in the write-only word line driver DW are connected, respectively, through cutting circuits $C_1$ through $C_m$ to the word lines $WL_1$ through $WL_m$. Also for the sake of simplicity, only the cutting circuit $C_1$ is illustrated in the figure. The emitters of the output transistors $T_{R1}$ through $T_{Rm}$ and $T_{W1}$ through $T_{Wm}$ are connected to the ground. The read word line driver DR further includes a current-absorption-inhibiting circuit INH for inhibiting the absorption of a current from the word lines $WL_1$ through $WL_m$ during a write operation.

The operation of the circuit shown in FIG. 2 is as follows.

To write data into the programmable memory cell PMC, a write inhibiting signal W is applied to an input terminal of the current-absorption-inhibiting circuit INH. The circuit INH then makes the collectors of the output transistors $T_{R1}$ through $T_{Rm}$ included in the read word line driving circuit DC to be at a high impedance. Thus the driving circuit DC is inhibited from absorbing currents from the word lines $WL_1$ through $W_m$. In this state, address signals $A_0$ through $A_n$ are input to a word line decoder WD. The word line decoder WD decodes the input address signals $A_0$ through $A_m$, to select one of the outputs $O_1$ through $O_m$ and turn it to the H level. Assume that the output $O_1$, for example, is selected to be at the H level. Then, the output transistor $T_{W1}$ in the write-only word line driver DW is turned on. When the bit line BL is selected at this state, a write-in current is drawn from the bit line BL through the programmable memory cell PMC and the word line $WL_1$ into the output transistor $T_{W1}$. Since the collectors of the output transistors $T_{R1}$ through $T_{Rm}$ are at a high impedance, the write-in current is not drawn into the read-only word line driver DR.

After the write operation is completed, the cutting circuits $C_1$ through $C_m$ disconnect the connections between the word lines $WL_1$ through $WL_m$ and the collectors of the output transistors $T_{W1}$ through $T_{Wm}$. Also, the write inhibiting signal W is removed. Thus, the read word line driver DR becomes able to absorb a reading current.

Since the output transistors $T_{R1}$ through $T_{Rm}$ in the read word line driver DR can absorb only the reading current, and since they are not required to absorb the writing current, the emitter area of each of these output transistors $T_{R1}$ through $T_{Rm}$ can be made small in comparison with the conventional output transistors in the word line driver. Accordingly, the accessing speed to the word line during a read operation is higher than the conventional accessing speed.

Figure 3:
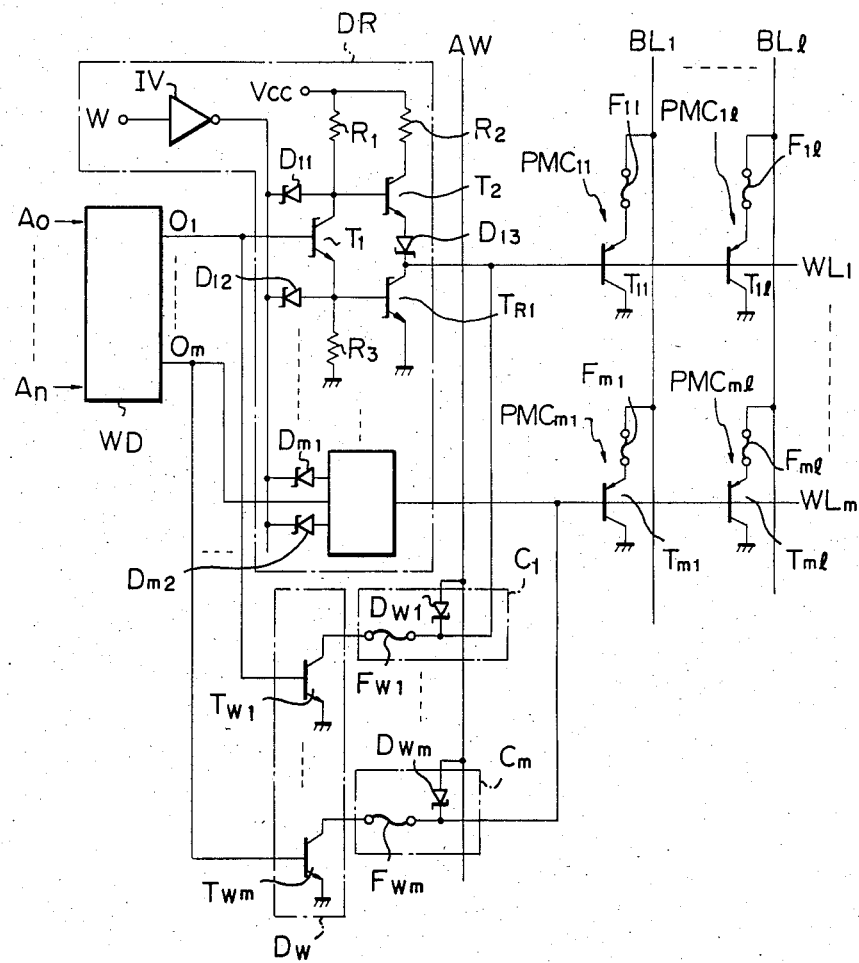
FIG. 3 is a circuit diagram showing details of the circuit shown in FIG. 2.

FIG. 3 shows details of the circuit shown in FIG. 2. In FIG. 3, the read word line driver DR comprises, between the output $O_1$ of the word line decoder WD and the word line $WL_1$, a transistor $T_1$, the base of which is connected to the output $O_1$ of the word line decoder WD, a transistor $T_2$, the base of which is connected to the collector of the transistor $T_1$, load resistors $R_1$ and $R_2$ connected between the collectors of the transistors $T_1$ and $T_2$ and a power supply line $V_{CC}$, a bias resistor $R_3$ connected between a common connecting point of the emitter of the transistor $T_1$ and the base of the transistor $T_{R1}$ and the ground, an inverter IV, the input of which is adapted to receive a write-inhibiting signal W, Schottky barrier diodes $D_{11}$ and $D_{12}$ connected between the bases of the transistors $T_2$ and $T_{R1}$ and the output of the inverter IV, and a diode $D_{13}$ connected between the emitter of the transistor $T_2$ and the collector of the transistor $T_{R1}$.

Between the other outputs $O_2$ through $O_m$ and the other word lines $WL_2$ through $W_m$, the same circuits as mentioned above are also constructed.

The read word line driver DW comprises the output transistors $T_{W1}$ through $T_{Wm}$, the bases of which are connected to the outputs $O_1$ through $O_m$ of the word line decoder WD.

In this embodiment, the cutting circuits $C_1$ through $C_m$, respectively, comprise fuses $F_{W1}$ through $F_{Wm}$ connected, respectively, between the collectors of the output transistors $T_{W1}$ through $T_{Wm}$ and the word lines $WL_1$ through $WL_m$, and reverse current preventing diodes $D_{W1}$ through $D_{Wm}$. The reverse current preventing diodes $D_{W1}$ through $D_{Wm}$, respectively, have cathodes connected to the word lines $WL_1$ through $WL_m$ and anodes commonly connected to a line AW. The line AW extends in parallel with the bit lines $BL_1$ through $BL_l$. The line AW is selected after a write operation is completed. The fuses $F_{W1}$ through $F_{Wm}$, respectively, have sufficient strength to resist cutting during a write operation.

A plurality of programmable memory cells $PMC_{11}$ through $PMC_{ml}$ are arranged on respectively intersecting portions between word lines $WL_1$ through $WL_m$ and bit lines $BL_1$ through $BL_l$. The programmable memory cells $PMC_{11}$ through $PMC_{ml}$, respectively, comprise, as is well known, fuse-type programmable elements $F_{11}$ through $F_{ml}$ and reverse current preventing PNP transistors $T_{11}$ through $T_{ml}$.

In the circuit shown in FIG. 3, to write data into the programmable memory cells $PMC_{11}$ through $PMC_{ml}$, the write-inhibiting signal W is set at the H level, whereby the base potential of the transistor $T_2$ is lowered and the transistor $T_2$ is turned off. As a result, the collector of the output transistor $T_{R1}$ in the read word line driver DR is made to a high impedance. Then, a write-in current is supplied from a bit line selected from $BL_1, \ldots,$ or $BL_l$, and depending on the amount of write-in current, the selected programmable memory cell $PMC_{11}, \ldots,$ or $PMC_{ml}$, is either destroyed or not destroyed, i.e., the fuse-type programmable element $F_{11}, \ldots,$ or $F_{ml}$ is broken or not broken. The write-in current supplied from the bit line $BL_1, \ldots,$ or $BL_l$ is absorbed by the write-only word line driver DW.

After completion of the write operation, a current much larger than the write-in current is supplied to the line AW. This large current breaks the fuses $F_{W1}$ through $F_{Wm}$. Thus, the write-only word line driver DW, which has a large parasitic capacitance, is electrically separated from the word lines. Thus the accessing speed to the word lines during a read operation is increased over the prior art because of the electrical separation of the write-only word line driver and because of the small emitter area of the output transistor $T_{R1}$. In addition, since the fuses $F_{W1}$ through $F_{Wm}$ are cut after the write operation, any write-in error thereafter can be prevented.

Figure 4:
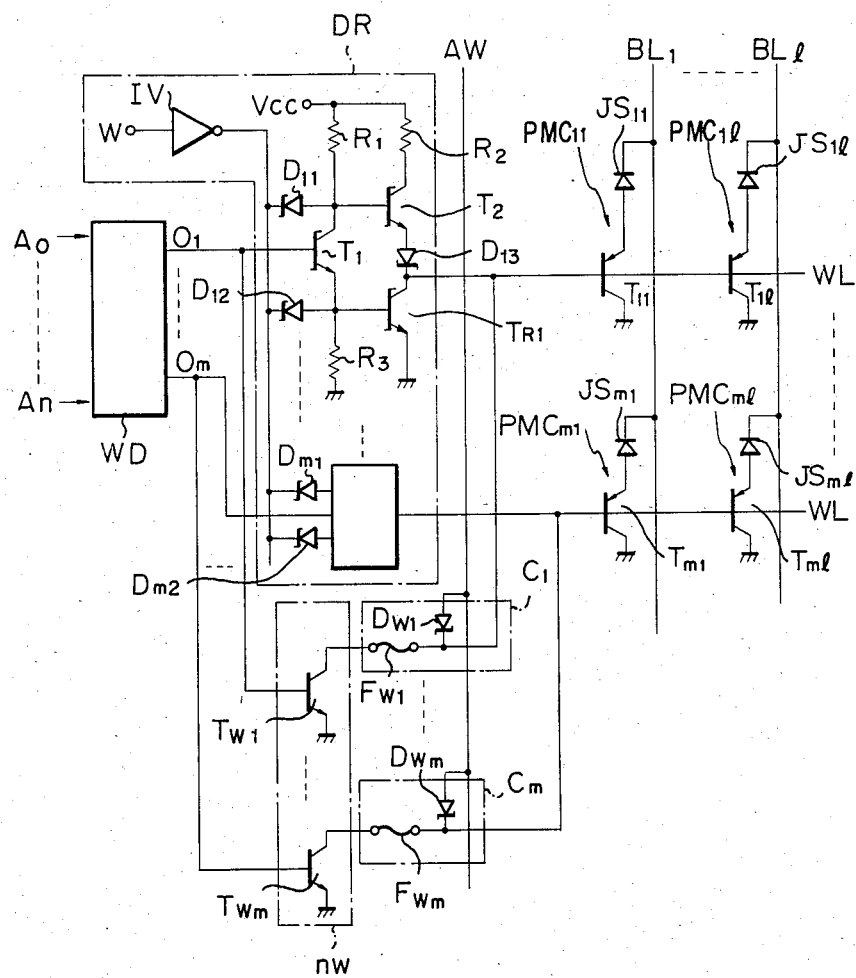
FIG. 4 is a circuit diagram showing a programmable semiconductor memory device according to another embodiment of the present invention.

FIG. 4 shows another embodiment of the present invention. In FIG. 4, the fuse-type programmable elements $F_{11}$ through $F_{ml}$ shown in FIG. 3 are replaced by junction-short type programmable elements $JS_{11}$ through $JS_{ml}$. The other portions are the same as those shown in FIG. 3. Each of the junction-short type programmable elements $JS_{11}$ through $JS_{ml}$ is formed by a diode having a cathode connected to the corresponding bit line and having an anode connected to the collector of the corresponding transistor. When a sufficiently large current is supplied to a selected bit line, the selected junction-short type element is short-circuited, and thereby a data of, for example, "1", is written-in.

In the foregoing embodiments, the read word line driver DR includes the current-absorption-inhibiting circuit INH. However, even when the current-absorption-inhibiting circuit INH is eliminated, the object of the present invention is still attained. That is, when the current-absorption-inhibiting circuit INH is eliminated, the write-in current is absorbed not only by the write-only word line driver DW but also by the read word line driver DR. However, since the current absorbed by the read word line driver DR is much smaller than the total write-in current, the emitter area of each of the output transistors $T_{R1}$ through $T_{Rm}$ may be small in comparison with the prior art.

From the foregoing description, it will be apparent that, according to the present invention, by separately providing a write-only word line driver and a read word line driver, the emitter area of an output transistor in the read word line driver can be made smaller than that of the prior art. As a result, in a programmable semiconductor memory device, the accessing speed to a word line during a read operation can be improved.

What is claimed:

1. A programmable semiconductor memory device comprising:
    a plurality of word lines;
    a plurality of bit lines intersecting said word lines;
    programmable memory cells arranged on respective intersecting portions between said word lines and said bit lines;
    a word line address decoder for selecting one of said word lines in response to an input address signal;
    a read word line driver for absorbing a current from the selected word line during a read operation of said programmable memory cells, based on the output signal from said word line address decoder;
    a write-only word line driver having a plurality of write-driving output transistors, each for absorbing a current from the selected word line during a write operation of said programmable memory cell, based on the output signal from said word line address decoder; and
    a cutting means for cutting, after completion of write operation, the connection between said write-driving output transistors and said word lines.

2. A programmable semiconductor memory device as set forth in claim 1, wherein said read word line driver comprises a current absorption inhibiting means for inhibiting the absorption of current from said word lines to said read word line driver during a write operation of said programmable memory cells.

3. A programmable semiconductor memory device as set forth in claim 2, wherein said cutting means comprises a plurality of fuses respectively connected between said write-only word line driver and said word lines, said fuses being broken after a writing operation is completed.

4. A programmable semiconductor memory device as set forth in claim 3, wherein said read word line driver comprises read-driving output transistors having collectors respectively connected to said word lines.

5. A programmable semiconductor memory device as set forth in claim 4, wherein said write-only word line driver comprises write-driving output transistors having collectors respectively connected through said fuses to said word lines.

6. A programmable semiconductor memory device as set forth in claim 5, wherein the emitter area of each of said read-driving transistors is smaller than the emitter area of each of said write-driving transistors.

* * * * *